United States Patent [19]
Lee

[11] Patent Number: 5,898,205
[45] Date of Patent: Apr. 27, 1999

[54] ENHANCED ESD PROTECTION CIRCUITRY

[75] Inventor: Jian-Hsing Lee, Hsin-chu, Taiwan

[73] Assignee: Taiwan Semiconductor Manufacturing Co. Ltd., Hsin-Chu, Taiwan

[21] Appl. No.: 08/891,381

[22] Filed: Jul. 11, 1997

[51] Int. Cl.[6] .................................................. H01L 23/62
[52] U.S. Cl. .......................................... 257/355; 257/361
[58] Field of Search ...................................... 257/355, 361

[56] References Cited

U.S. PATENT DOCUMENTS 5,491,358  2/1996  Miyata .
5,543,650  8/1996  Au et al. .

Primary Examiner—Stephen D. Meier
Attorney, Agent, or Firm—Tung & Associates

[57] ABSTRACT

An apparatus and method are disclosed for enhancing the operation of ESD protective circuits in a VLSI chip, having first and second CMOS devices therein which prevent damage due to ESD events, the first device being connected between a Vss contact and an I/O Pad contact and the second device being connected between a Vcc contact and the I/O Pad contact, and including diffusions in the chip that form a first diode which turns ON when negative ESD stresses develops between one of the first and second contacts and the I/O Pad contact, and which form a NPN transistor and a second diode that turn ON when positive ESD stresses develop between one of the first and second contacts and the I/O Pad contact, and additionally having the Vss and Vcc sources capacitively coupled.

15 Claims, 1 Drawing Sheet

ENHANCED ESD PROTECTION CIRCUITRY

FIELD OF THE INVENTION

The present invention generally relates to ESD protection circuits for semiconductor devices and, more particularly, to an internal ESD protection circuit for semiconductor devices that utilizes the insertion of a capacitor in the line between an operating potential bus Vcc and the negative power source bus Vss.

BACKGROUND OF THE INVENTION

With recent advances in the development of high density very large scale integration (VLSI) circuits, the dimensions of the devices continue to shrink resulting in a corresponding decrease in the gate oxide thicknesses in the CMOS devices. This decrease, relative to breakdown voltage, has resulted in the greater susceptibility of these devices to damage from the application of excessive voltages such as caused by an electrostatic discharge (ESD) event. During an ESD event, charge is transferred between one or more pins of the integrated circuits and another conducting object in a short period of time, typically less than one microsecond. The charge transfer generates voltages that are large enough to break down insulating films, e.g., gate oxides on MOSFET devices, or that can dissipate sufficient energy to cause electrothermal failures in the devices. Such failures include contact spiking, silicon melting, or metal interconnect melting. Consequently, in order to deal with transient ESD pulses, an integrated circuit must incorporate protection circuits at every input and I/O pin. Various circuit structures for ESD protection can be found, e.g., in U.S. Pat. Nos. 5,019,888 to Scott et al; 5,182,220 to Ker et al; 5,218,222 to Roberts; and 5,329,143 to Chan; and in the literature in "Internal Chip ESD Phenomena Beyond the Protection Circuit", C. Duvvury, IEEE Transactions on Electron Devices, Vol.35, No.12, Dec. 1988; "A Low-Voltage Triggering SCR for On-Chip ESD Protection at Output and Input Pads", A. Chatterjee, IEEE Electron Device Letters, Vol.12, No.1, Jan. 1991; and "ESD Protection in a Mixed Voltage Interface and Multi-Rail Disconnected Power Grid Environment in 0.50 - and 0.25-$\mu$m Channel Length CMOS Technologies", S. Voldman, EOS/ESD Symposium Proceedings, pp. 125–134, 1994.

An example of an integrated circuit having such protection is shown in FIG. 1, which is a cross-sectional view of a conventional integrated circuit (IC) device 10 fabricated from a semiconductor substrate 12 of a first conductivity type, such as P-type conductivity, with various diffusions and circuit components formed thereon including those for protecting against ESD damage due to excessive stresses occurring between applied voltages Vss and Vcc and the voltage on an I/O Pad 15. Specifically, on the left side of the Pad, is a thin-oxide NMOS field-effect transistor (MOSFET) 26, composed of N+ regions, 18 and 20, and a gate electrode 22, with a thin oxide 24 therebetween, and having its outer N+ region 18 coupled to an adjacent outer P+ conductivity region 14, which is connected by a contact or bus 16 to a negative voltage source Vss. The inner N+ region 20 is also coupled to an adjacent P+ conductivity region 14 connected to negative voltage source Vss, This NMOS thick-field device 26 deals with either positive or negative ESD stresses developed between the Vss voltage on contact 16 and the voltage communicated from the Pad 15 to a Pad-connected contact 28 on inner N+ region 20. As illustrated in the Figure, the N+ diffusion regions, 18 and 20, and underlying P-type substrate 12 act as a bipolar device T1 when there is an excessive positive stress on the Pad contact 28 with respect to Vss, i.e., a parasitic lateral NPN transistor results, with its base at the substrate 12, its emitter at N+ area 18, and its collector at N+ area 20, which breaks down to offer protection to the other circuit devices. Specifically, junction breakdown occurs, typically at about 13 volts for a CMOS device, and the generated electrons are swept into the collector region 20. The generated holes injected into the base region 12 cause the substrate voltage to increase, forward biasing the emitter junction, and causing the transistor T1 to turn ON. As a consequence, injection of electrons from the emitter 18 into the base 12 is increased and those electrons reaching the collector base junction generate new electron hole pairs and current growth continues. This "positive feedback" causes the emitter-to-collector current to increase indefinitely resulting in damage to the device if the current is not somehow limited. When a negative stress on the Pad contact 28 with respect to Vss occurs, a forward biased diode D1 results between P+ region 14 and N+ region 20, through the substrate 12, that will turn ON to protect the other integrated devices.

On the other side of the Pad contact 28, and coupled thereto is a P-channel device comprised of an N-well 30 in the substrate 12 containing P+ regions 32 and 34 which have a gate electrode 36 disposed above and extending between them with a thin oxide 38 therebetween so as to form a thin-oxide PMOS field-effect transistor (MOSFET) 40. A contact or bus 42, coupled to an operating voltage source Vcc, connects outer P+ region 34 to an outer N+ region 44 also within the N-well 30. The inner P+ region 32 is coupled to Pad contact 28 and has an adjacent N+ conductivity region 44 connected to operating voltage source Vcc, with both regions 32 and 44 also within the N-well 30. The PMOS device 40 deals with either positive or negative ESD stresses developed between the Vcc voltage on contact 42 and the voltage on the Pad-connected contact 28. When an ESD stress is set up with respect to Vcc and contact 28, diodes D2 result between the P+ region 32 and the N+ regions 44, through the N-well 30. In particular, when there is an excessive positive stress on the Pad contact 28 with respect to Vcc, diodes D2 will turn ON, while when this ESD stress event is negative diodes D2 will suffer avalanche-breakdown. It will thus be seen that such a prior art construction while offering a degree of protection from ESD events still may suffer breakdown and damage.

It is therefore an object of the present invention to provide an enhanced ESD protection performance apparatus and method to protect VLSI circuits and particularly CMOS devices.

It is another object of the present invention to provide an enhanced ESD protection performance apparatus and method to protect VLSI circuits and particularly CMOS devices utilizing the addition of at least one capacitance in the line between the Vcc and Vss sources.

SUMMARY OF THE INVENTION

The present invention involves an apparatus and method embodied in an improved combination of elements in VLSI circuits that act to couple two conventional ESD protection devices to each other using a capacitor to reduce the reverse operation effect on the devices. In particular, the two protective devices, an NMOS FET and a PMOS FET, have their inner N+ and P+ regions connected to the same contact of an I/O Pad, and their outer N+ and P+ regions connected respectively to separate contacts which are coupled to voltage sources Vss and Vcc, respectively, in common with respective added outer P+ and N+ regions. This prior art configuration is enhanced in accordance with the invention by the provision of additional N+ regions or poly-oxide regions disposed in the circuit between PMOS and NMOS. For conventional I/O, the region between NMOS and PMOS is empty to avoid the latch-up. The width of this empty region is greater than 40 µm, i.e., large enough to create a large capacitor. In addition, the die size does not increase due to the capacitor buried in this empty region. The additional N+ regions or poly connect to the Vcc source that is connected to the P-channel protective device. A capacitor is inserted into a line connecting the Vcc source and the Vss source which is coupled to the other protective device. As a result, respective capacitances will be set up between the additional N+ regions and the inner N+ region of the NMOS device through the base of an NPN transistor or one side of a diode, respectively formed upon the occurrence of positive and negative ESD stress events with respect to Vss. A second diode is formed between the inner P+ region of the PMOS device and the adjacent added outer N+ region upon the occurrence of positive ESD stress events with respect to Vss and Vcc. With this arrangement, if the capacitor is large enough, the line between the Vss and Vcc sources may be shorted by an ESD stress event. Alternatively, the resulting transistor and second diode will turn ON when there is an excessive positive stress on the Pad with respect to Vss or Vcc. Further, the first diode will turn ON when there is an excessive negative stress on the Pad with respect to Vss or Vcc, avoiding diode breakdown and damage.

Considering the effect of this improved structure on the two protective devices, it will be seen that when there is an excessive positive stress on the Pad contact with respect to Vss, the second diode and transistor will turn ON. On the other hand, when there is a negative stress on the Pad contact with respect to Vss, the first diode turns ON. When there is an excessive positive stress on the Pad contact with respect to Vcc, the second diode and the transistor will again turn ON, while when there is a negative stress on the Pad contact with respect to Vcc, the first diode turns ON.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides an apparatus and method for protecting VLSI circuits and particularly CMOS devices therein, which are embodied in an improved combination of elements that act to couple two conventional ESD protection devices to each other using a capacitor connected between Vss and Vcc sources along with additional doping to reduce the reverse operation effect on the devices.

Figure 1:
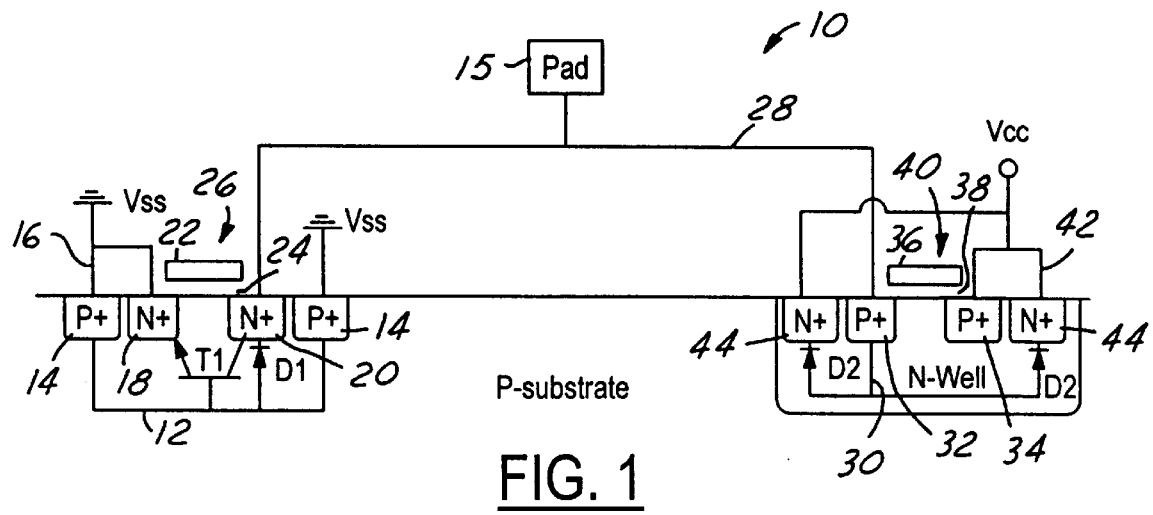
FIG. 1 is a diagrammatic illustration in section of a semiconductor device including a conventional ESD protection circuit.

Referring again to FIG. 1, a conventional integrated circuit (IC) device 10, as shown, has a semiconductor substrate 12 of P-type conductivity with various diffusions and circuit components formed therein for protecting against ESD damage due to excessive stresses occurring between applied voltages Vss and Vcc and the voltage on the I/O Pad.

On the left side of the Pad, first P+ conductivity region 14 is connected by Vss contact 16 to the N-channel device, composed of N+ regions, 18 and 20, and gate electrode 22 extending between them with thin oxide 24 interposed so as to form the thin-oxide NMOS field-effect transistor (MOSFET) 26. This NMOS device 26 deals with either positive or negative ESD stresses developed between the Vss voltage on contact 16 and the voltage communicated from the Pad to the Pad-connected contact 28 on N+ A 0 region 20. As shown in the Figure, the N+ diffusion areas, 18 and 20, and underlying P-type substrate 12 act as a bipolar device T1 when there is an excessive positive stress on the Pad contact 28 with respect to Vss, i.e., a parasitic lateral NPN transistor T1 results, with its base at the substrate 12, its emitter at N+ area 18, and its collector at N+ area 20, which turns ON, typically at about 13 volts for a CMOS device, to offer protection to the other circuit devices. However, once turned ON, current growth may continue by "positive feedback" indefinitely resulting in damage to the device if the current is not somehow limited. Conversely, when a negative stress on the Pad contact 28 with respect to Vss occurs, forward biased diode DI results between P+ region 14 and N+ region 20, through the substrate 12, and will turn ON to protect the other integrated devices.

On the other side of the Pad contact 28, P-channel device 40, formed by N-well 30 in the substrate 12 containing P+ regions 32 and 34 which have gate electrode 36 disposed above them with thin oxide 38 therebetween, amounts to a thin-oxide PMOS field-effect transistor (MOSFET). Vcc contact 42 connects P+ region 34 to N+ region 44 also within the N-well 30. The PMOS device 40 deals with either positive or negative ESD stresses developed between the Vcc voltage on contact 42 and the voltage on the Pad-connected contact 28. It will be seen that diodes D2 result between the P+ region 32 and the N+ regions 44, through the N-well, when an ESD stress is set up with respect to Vcc and contact 28. In particular, when there is an excessive positive stress on the Pad contact 28 with respect to Vcc, diodes D2 will turn ON, while when this ESD stress event is negative diodes D2 will suffer avalanche-breakdown and damage.

Figure 2A:
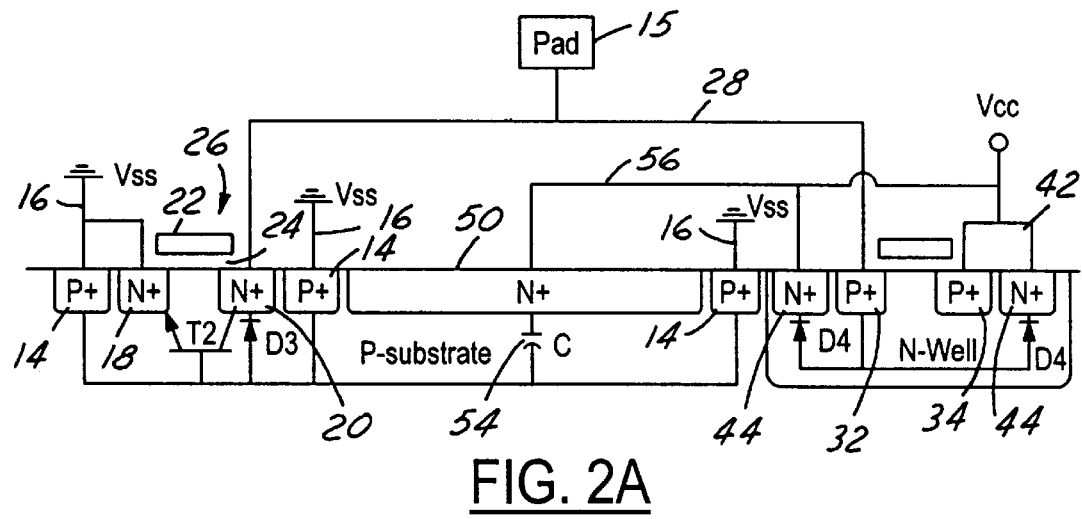
FIGS. 2A and 2B are diagrammatic illustrations in section of a semiconductor device including an ESD protection circuit in accordance with the present invention.
Figure 2B:
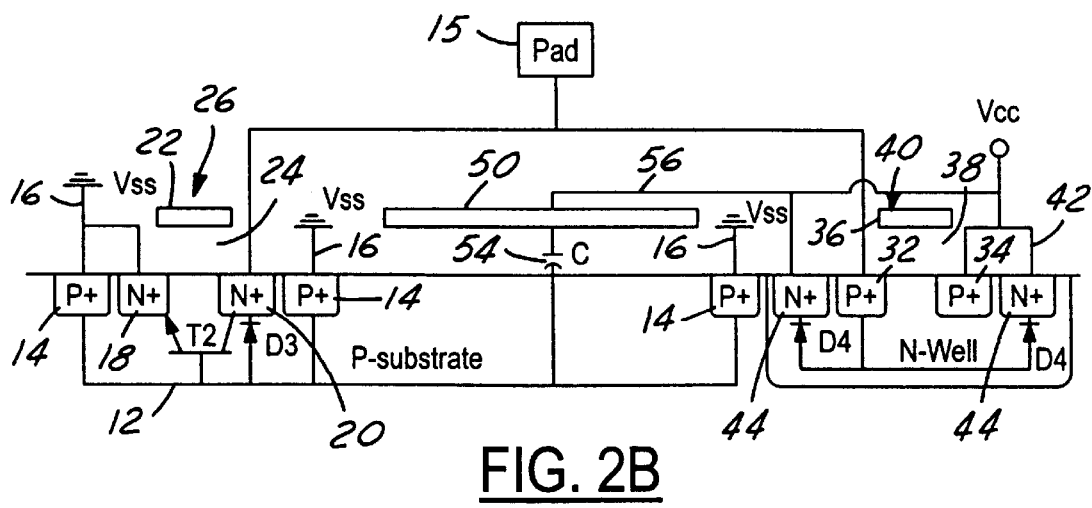

In the foregoing type of prior art integrated circuit device the reverse-bias pass voltage of the ESD protection devices is smaller than the forward-bias pass voltage and the protection devices often fail in reverse mode. To enhance the ESD protection performance of the foregoing type of prior art circuit device, an improved combination is presented in accordance with the present invention which couples the ESD protection devices to each other to reduce the reverse operation effect. As seen in FIG. 2A, N+ region 50 is formed or diffused into the substrate 12 inside of the two MOSFET devices 26 and 40. This region, 50 is electrically coupled to the Vcc source by a connection 56. A capacitor 54 is coupled between N+ region 50 and adjacent P+ regions 14. With this arrangement, if the capacitor 54 is large enough, the line between Vss and Vcc may be shorted by an ESD stress event which would avoid internal circuit damage. Additionally, in accordance with the invention the transistor T1 and diodes D1 and D2 of the prior art arrangement will be modified, and are shown as modified as transistor T2 and diodes D3 and D4. Alternatively, the N+ region 50 may be formed as a gate electrode extending between the P+ region 14 as shown in FIG. 2B. In this case, capacitances C will be set up between the electrode 50 and regions 14 and diode D3, respectively, as well as the base of transistor T2.

Considering the effect of this improved structure on the two protective devices, it will be seen that when there is an excessive positive stress on the Pad contact 28 with respect to Vss, diodes D4 and transistor T2 will turn ON. On the other hand, when there is a negative stress on the Pad contact 28 with respect to Vss, diode D3 turns ON. When there is an excessive positive stress on the Pad contact 28 with respect to Vcc, diodes D4 and transistor T2 will again turn ON, while when there is a negative stress on the Pad contact 28 with respect to Vcc, diode D3 again turns ON. Thus, for the various forms of ESD stresses that can be imposed on the protective devices controlled current discharge will result avoiding serious damage to the integrated circuit devices.

It will therefore be seen that an apparatus and method have been presented that enhance the operation of the ESD protective circuits in VLSI chips and particularly CMOS devices therein to prevent damage thereto.

While the present invention has been described in an illustrative manner, it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations within the scope of the invention.

The embodiments of the invention in which an exclusive property or privilege is claimed are defined in the following claims:

I claim:

1. Apparatus for enhancing the operation of ESD protective circuits in a VLSI chip, having CMOS devices therein to prevent damage thereto, comprising:

an I/O Pad contact on said chip;

a first contact on said chip coupled to a Vss source;

a second contact on said chip coupled to a Vcc source;

a first protective CMOS FET disposed in said chip and connected between said Vss contact and said I/O Pad contact;

a second protective CMOS FET disposed in said chip and connected between said Vcc contact and said I/O Pad contact;

means for forming a first diode that turns ON when negative ESD stresses develope between one of said first contact and said second contact and said I/O Pad contact;

means for forming a NPN transistor and a second diode that turn ON when positive ESD stresses develope between one of said first contact and said second contact and said I/O Pad contact; and wherein the improvement comprises:

means, disposed in said chip between said first and second protective CMOS FETs, for coupling said first diode to said Vss source;

means, connected at one end to said Vcc source and at the other end to said means for coupling said first diode to said Vss source, for capacitively coupling said Vss source and said Vcc source.

2. Apparatus as in claim 1 wherein said first protective CMOS FET is an NMOS FET and said second protective CMOS FET is a PMOS FET.

3. Apparatus as in claim 2 wherein:

said first protective NMOS FET comprises outer and inner N+ regions disposed in a P-substrate with a first gate electrode extending above and therebetween;

said second protective PMOS FET comprises outer and inner P+ regions disposed in an N-well in said P-substrate with a second gate electrode extending above and therebetween; said I/O Pad contact couples said inner N+ and P+ regions;

said means for forming said transistor comprises a second P+ region in said P-substrate outside and adjacent said outer N+ region;

said first contact couples said Vss source to said second P+ region and said outer N+ region;

said means for forming a second diode comprises a second N+ region in said N-well outside and adjacent said outer P+ region;

said second contact couples said Vcc source to said second N+ region and said outer P+ region;

said means for forming said first diode comprises:

a third P+ region in said P-substrate coupled to said inner N+ region in said P-substrate;

means for connecting said third P+ region to said Vss source; and said means for capacitively coupling said Vss source and said Vcc source comprises a fourth P+ region connected between said Vss source and said other end.

4. Apparatus as in claim 3 wherein said means for capacitively coupling said Vss source and said Vcc source comprises:

an electrical connection, including a third N+ region in said P-substrate disposed between said first and second protective CMOS FETs and coupled between said Vss source and said Vcc source; and a capacitor connected into said electrical connection.

5. Apparatus as in claim 3 wherein said substrate is of silicon.

6. Apparatus as in claim 3 wherein said means for capacitively coupling said Vss source and said Vcc source comprises:

a fourth P+ region in said P-substrate connected to said Vss source;

an electrical connection, including a gate electrode extending between said third and fourth P+ regions, coupling said Vss source and said Vcc source; and a capacitor connected into said electrical connection.

7. Apparatus for enhancing the operation of ESD protective circuits in a VLSI chip, having CMOS devices therein to prevent damage thereto, comprising:

a first protective FET having outer and inner regions of one conductivity type disposed in a substrate of the opposite conductivity type with a first gate electrode extending above and therebetween;

a second protective FET having outer and inner regions of the opposite conductivity type disposed in a well of the one conductivity type in said substrate with a second gate electrode extending above and therebetween;

an I/O Pad contact coupling said inner regions;

a second region of the opposite conductivity type in said substrate outside and adjacent said outer region of the one conductivity type;

a first contact coupled to a Vss source and connected to said second region of the opposite conductivity type and said outer region of the one conductivity type;

a second region of the one conductivity type in said well outside and adjacent said outer region of the opposite conductivity type;

a second contact coupled to a Vcc source and connected to said second region of the one conductivity type and said outer region of the opposite conductivity type;

a third region of the one conductivity type in said substrate inside of said inner region of the opposite conductivity type and coupled to said Vcc source;

a fourth region of the opposite conductivity type in said substrate inside of said inner region of the one conductivity type and coupled to said Vss source;

wherein the improvement comprises:

a fifth region of the opposite conductivity type in said substrate inside of said third region of the one conductivity type and coupled to said Vss source; and means for capacitively coupling said Vss source and said Vcc source through said fourth and fifth regions of the opposite conductivity type.

8. Apparatus as in claim 7 wherein said one conductivity type is N+ and said second conductivity type is P+.

9. Apparatus as in claim 7 wherein said means for capacitively coupling said Vss source and said Vcc source comprises:

an electrical connection, including a fourth region of the one conductivity type disposed in said substrate between said fourth and fifth regions of the opposite conductivity types and coupling said Vss source and said Vcc source; and a capacitor connected into said electrical connection.

10. Apparatus as in claim 7 wherein said substrate is of silicon.

11. Apparatus as in claim 7 wherein said means for capacitively coupling said Vss source and said Vcc source comprises:

an electrical connection, including a gate electrode extending between said fourth and fifth regions of the opposite conductivity type, coupling said Vss source and said Vcc source; and a capacitor connected into said electrical connection.

12. Apparatus for enhancing the operation of ESD protective circuits in a VLSI chip having CMOS devices therein to prevent damage thereto, said chip comprising:

a protective NMOS FET having outer and inner N+ regions disposed in a P-substrate with a first gate electrode extending above and therebetween;

a protective PMOS FET having outer and inner P+ regions disposed in an N-well in said P-substrate with a second gate electrode extending above and therebetween;

an I/O Pad contact coupling said inner N+ and P+ regions and contacting said N-well;

a first P+ region in said P-substrate outside and adjacent said outer N+ region;

a first contact coupled to a Vss source and connected to said first P+ region and said outer N+ region;

a first N+ region in said N-well outside and adjacent said outer P+ region;

a second contact coupled to a Vcc source and connected to said a first N+ region and said outer P+ region;

a second N+ region in said N-well inside of said inner P+ region;

a second P+ region in said P-substrate inside of said inner N+ region and connected to said Vss source; and wherein the improvement comprises the steps of:

a third P+ region in said P-substrate inside of said second N+ region and connected to said Vss source;

means, connected to said second and third P+ regions, for capacitively coupling said Vss source and said Vcc source.

13. Apparatus as in claim 12 wherein said substrate is of silicon.

14. Apparatus as in claim 12 wherein said means for capacitively coupling said Vss source and said Vcc source comprises:

an electrical connection, including a third N+ region disposed in said P-substrate between said second and third P+ regions and coupling said Vss source and said Vcc source; and a capacitor connected in said electrical connection between said third N+ region and said second and third P+ regions.

15. Apparatus as in claim 12 wherein means for capacitively coupling said Vss source and said Vcc source comprises:

an electrical connection, including a gate electrode extending between said second and third P+ regions, and coupling said Vss source and said Vcc source; and a capacitor connected in said electrical connection between said gate electrode and said second and third P+ regions.

* * * * *